United States Patent [19]
Tipon

[11] Patent Number: 5,179,299
[45] Date of Patent: Jan. 12, 1993

[54] CMOS LOW OUTPUT VOLTAGE BUS DRIVER

[75] Inventor: Donald G. Tipon, San Diego, Calif.

[73] Assignee: NCR Corporation, Dayton, Ohio

[21] Appl. No.: 608,788

[22] Filed: Nov. 5, 1990

[51] Int. Cl.[5] ............................................. H03K 3/01
[52] U.S. Cl. .................................... 307/443; 307/475; 307/451; 307/465; 365/154
[58] Field of Search ............... 307/443, 475, 451, 465; 365/154

[56] References Cited

U.S. PATENT DOCUMENTS

| | | | |
|---|---|---|---|
| 4,329,600 | 5/1982 | Stewart | 307/540 |
| 4,488,067 | 12/1984 | Kraft et al. | 307/473 |
| 4,531,068 | 7/1985 | Kraft et al. | 307/473 |
| 4,638,187 | 1/1987 | Boler et al. | 307/451 |
| 4,766,334 | 8/1988 | Warner | 307/443 |
| 4,782,250 | 11/1988 | Adams et al. | 307/473 |
| 4,855,623 | 8/1989 | Flaherty | 307/475 |
| 4,864,165 | 9/1989 | Hoberman et al. | 307/405 |
| 4,874,967 | 10/1989 | Deane | 307/296.3 |
| 4,877,978 | 10/1989 | Platt | 307/473 |
| 4,947,063 | 2/1990 | O'Shaughnessy et al. | 307/443 |
| 4,992,678 | 2/1991 | Saawo et al. | 307/443 |
| 5,004,936 | 4/1991 | Andresen | 307/443 |

OTHER PUBLICATIONS

"High Speed Complementary Driver Circuit," by W. R. Griffin and P. N. Horowitz, IBM Technical Disclosure Bulletin, vol. 24, No. 5, Oct. 1981, pp. 2558–2559.

Primary Examiner—William L. Sikes
Assistant Examiner—Scott A. Ouellette
Attorney, Agent, or Firm—Gregory P. Gadson

[57] ABSTRACT

In a high speed digital computer data transfer system, a data bus driver reduces data bus voltage swings between logic high and logic low levels by defining minimum and maximum bus voltages which lie between said logic levels, thus lowering bus transition and hence data transfer times. Positive and negative overshoot of the reduced bus logic levels are prevented by "clamping diode" transistors. The data bus driver assumes a tri-state mode when not transmitting data, during which the clamping diode transistors also eliminate positive and negative bus voltage overshoot. The preferred embodiment is implemented using complementary metal-oxide-semiconductor (CMOS) technology.

8 Claims, 4 Drawing Sheets

CMOS LOW OUTPUT VOLTAGE BUS DRIVER

FIELD OF THE INVENTION

The present invention generally relates to computer data transfer systems, and more particularly to means for increasing the data transfer speed of data buses suitable for use in microprocessor chips.

BACKGROUND OF THE INVENTION

Prior art data transfer systems, such as the system 100 in FIG. 1, often contain a pre-charging transistor 102 coupled to a data bus 104 for precharging the bus 104 to a logic high level (e.g., 5 volts). This approach normally assumes that it is faster to pull the bus voltage down to a logic low level (e.g., 0 volts) from the logic high level, than the reverse. Pull-down transistors 106, 110 and 114 with their respective bus logic 108, 112 and 116 are operated to pull the bus voltage down to the logic low level by creating conduction paths to ground when activated.

The bus 104 is maintained at a logic high voltage, which voltage is nearly instantaneously available at an input of an inverter 118. The bus 104 is pulled down when a logic low voltage is to be provided to the inverter 118. Pre-charging can thus increase the operating speed of data transfer systems.

However, repeated pre-charging cycles without the intervention of a pull-down operation can raise the pre-charge voltage to such a high level that the overall advantage of pre-charging is lost since the time for going from the logic high voltage to the logic low voltage is directly proportional to the precharge voltage. Even where there is not repeated precharging, the bus transition time for changing from the logic high voltage level to the logic low voltage level, and vice versa, may still be undesirably large for some high-speed applications.

SUMMARY OF THE INVENTION

It is an object of the present invention to provide a data transfer system with high data transfer speed.

It is also an object of the present invention to decrease data bus voltage swings.

It is a further object of the present invention to provide a minimum bus voltage and a maximum bus voltage, both of which fall between the system logic high and logic low voltage levels.

Another object of the present invention is to provide clamping action in the case of bus voltage overshoot.

Yet another object of the present invention is to provide clamping action in the case of bus voltage undershoot.

It is another object of the present invention to provide such a restricted voltage swing system with a device for converting the bus voltages to the correct logic levels.

An additional object of the present invention is to implement such a data transfer system using complementary metal-oxide-semiconductor (CMOS) technology.

It is yet another object of the present invention to implement a data transfer system meeting the above objects using microprocessor chips.

There is provided in accordance with the present invention a high speed digital computer data transfer system for transferring data in the form of first and second logic level signals, the data transfer system having reduced bus state transition time. The system includes, inter alia:

a data transfer bus for transferring the first and second logic level signals;

a driver connected to the data transfer bus for driving the data transfer bus; and a clamping means connected to the data transfer bus for preventing the voltage on the data transfer bus from transcending the range defined by the first and second logic levels.

The details of the present invention will be revealed in the following description with reference to the attached drawings.

DESCRIPTION OF THE PREFERRED EMBODIMENT

Figure 1:
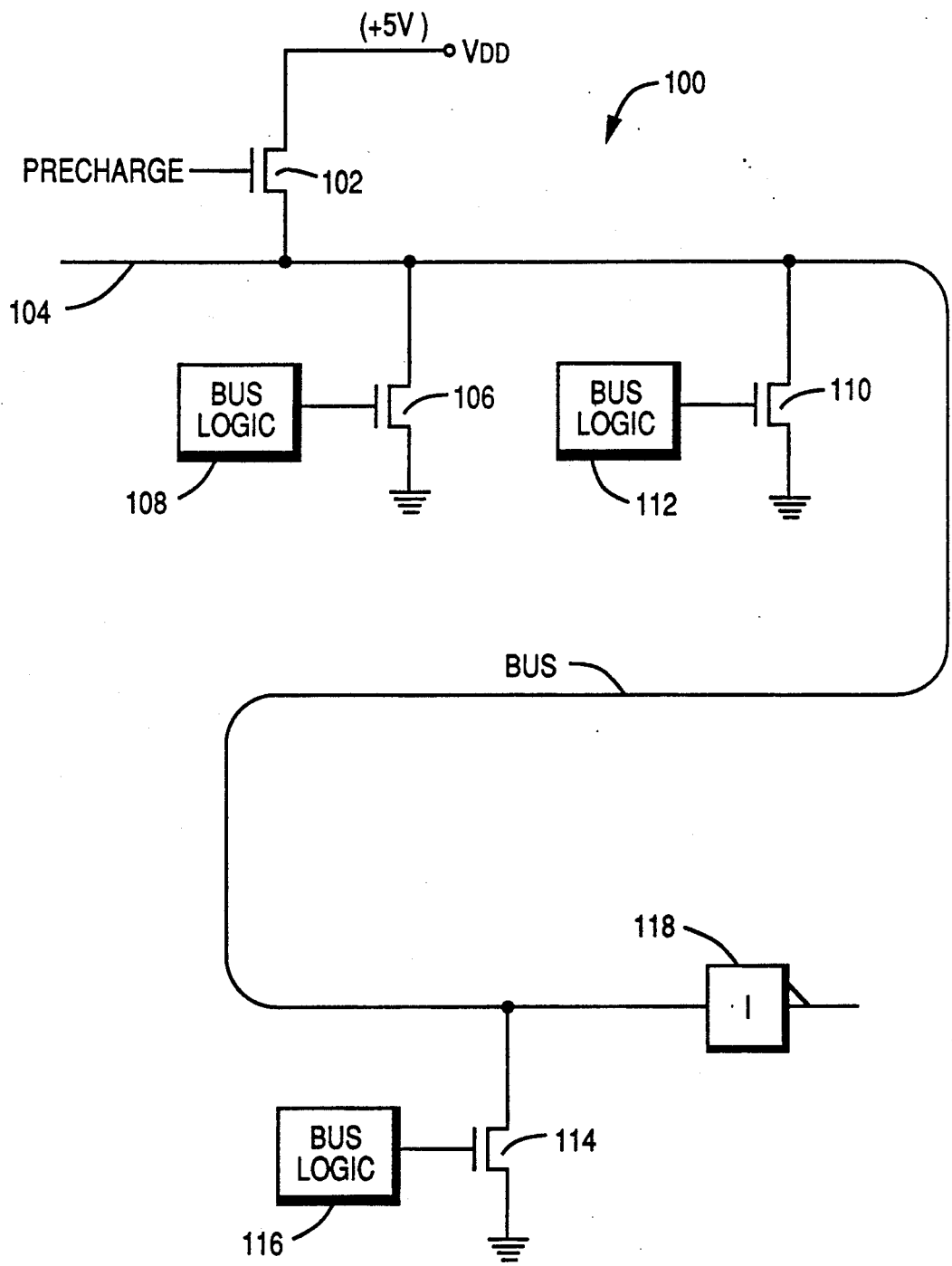
FIG. 1, previously discussed, is a generalized schematic diagram of a prior art data transfer system.
Figure 2:
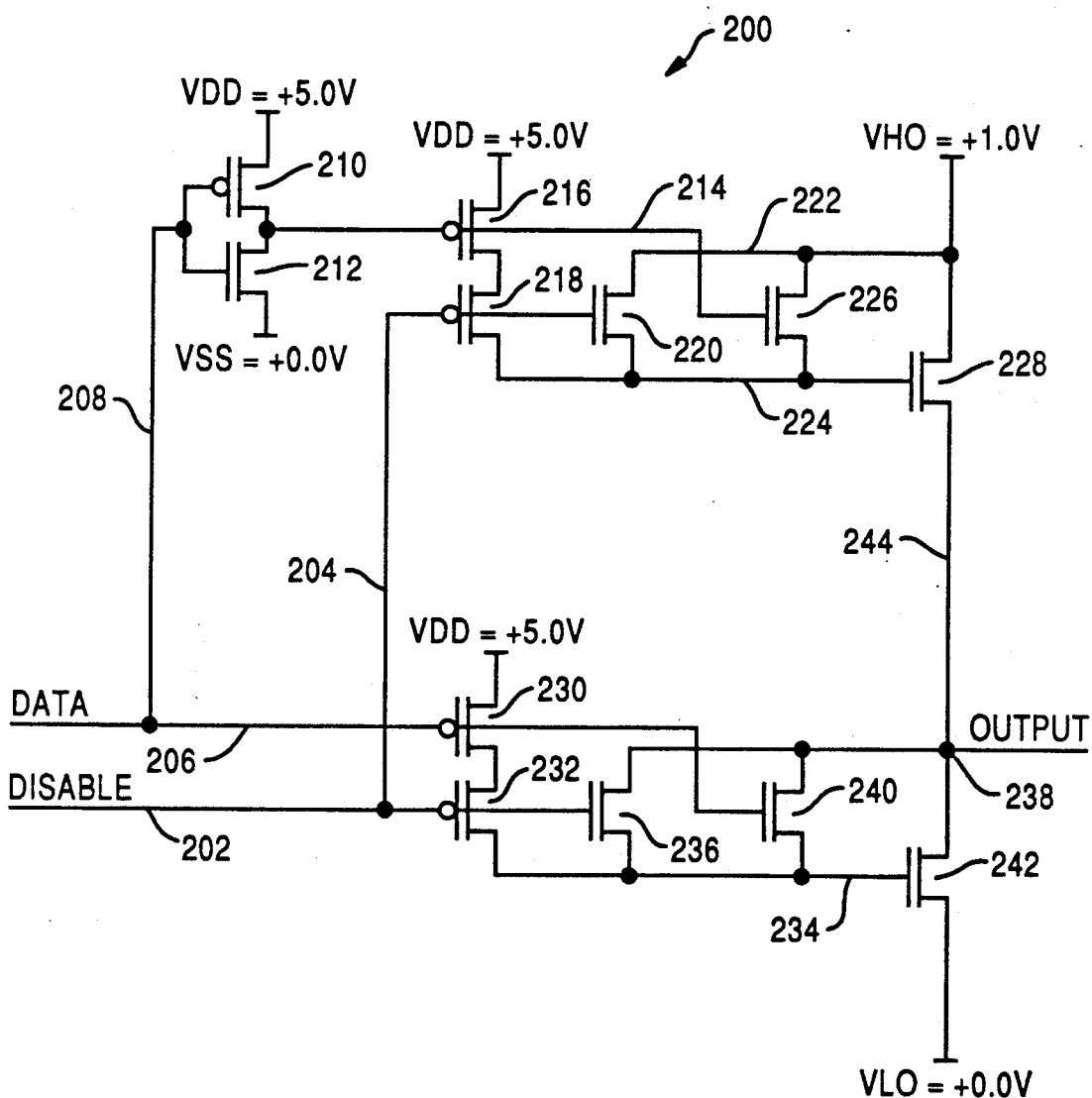
FIG. 2 is a detailed schematic diagram of the preferred embodiment of the present inventive data transfer system.

FIG. 2 shows the preferred embodiment for a high speed computer data bus driver 200 implemented using CMOS technology for transferring data signals DATA (via a data input line 206) in the form of logic high and logic low voltages. The bus driver is connected by its output node 238 to a data transfer bus (not shown) via an input buffer (also not shown), the details of these items not being described since they are not part of the present invention. All transistors are of the junction field-effect type (JFET), with a bubble at the gate indicating a p-channel device, and the absence of a bubble at the gate indicating an n-channel device. The data bus driver 200 will be described in connection with data transfer operations.

Figure 3:
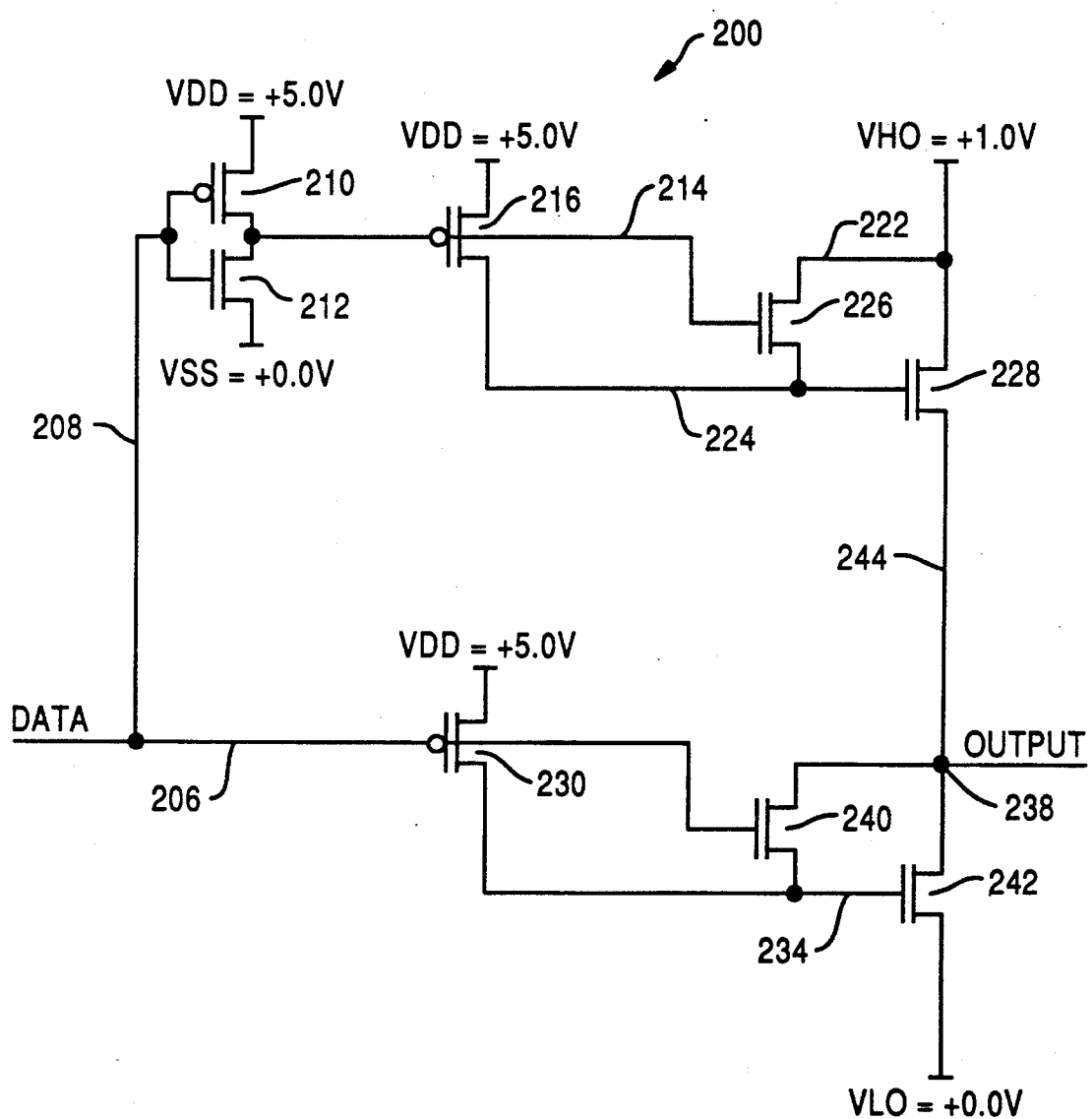
FIG. 3 is an electrical equivalent of the schematic diagram in FIG. 2 when the DISABLE signal is set to 0.0 volts.

The data bus driver 200 is enabled (allowing it to transfer data) by setting the DISABLE signal at line 202 to 0.0 volts. In this mode transistors 218 (via line 204) and 232 turn on (are conducting), while transistors 220 (connected to VHO via line 222) and 236 turn off (nonconducting). In this condition, the circuit in FIG. 2 behaves like the circuit in FIG. 3, the circuit in FIG. 3 being used here only for pedagogical reasons.

While the bus driver 200 is in the enabled state, if the DATA signal is a CMOS logic low signal (0.0 volts), a transistor 230 turns on and a transistor 240 turns off, which places 5.0 volts on a line 234. This turns on a transistor 242, and pulls the output node 238 to VLO (0.0 volts), which is the low voltage level output by the driver 200 during data transfers. The logic low DATA signal also turns on (via line 208) transistor 210, and turns off transistor 212, the result of which is to place 5.0 volts on a line 214. The 5.0 volts on line 214 turns off transistor 216 and turns on transistor 226. This places a line 224 at VHO (1.0 volts), which is the high voltage level output by the driver 200 during data transfers, and is also the data bus pre-charge voltage. VLO and VHO represent the logic low (0) and logic high (1) voltage swing levels used on the data transfer bus, in order to reduce bus transition times.

VHO at the gate of transistor 228 is normally not enough to activate it. However, transistor 228 is turned on if the voltage at the output node 238 (via line 244) falls below VHO-VT$_{228}$, where VT$_{228}$ represents the threshold voltage (for conducting) of the transistor 228. If the transistor 228 is activated, it will pull the voltage at 238 up until the node voltage is no longer low enough to cause it to conduct. Thus, transistor 228 acts like a clamping diode to ensure that negative overshoots (voltages below VLO) do not occur. VHO and VLO are of course chosen so that the transistor 228 does not turn on until the voltage at the output node 238 falls below VLO.

Still assuming that the data bus driver 200 is in the enabled state, if the DATA signal is at the CMOS logic high level, the transistor 210 is turned off while the transistor 212 is turned on, which pulls the line 214 down to 0.0 volts. The voltage on line 214 turns on the transistor 216 and turns off the transistor 226, which places the line 224 at 5.0 volts. The 5.0 volts on line 224 turns on the transistor 228, which passes VHO to the output node 238. The 5.0-volt DATA signal also turns off the transistor 230 and turns on the transistor 240, which places the line 234 and the output node 238 at the same level.

In the preferred embodiment, VHO at the gate of transistor 242 is normally not enough to activate it. However, transistor 242 is turned on if the voltage at the output node 238 rises above VLO +VT$_{242}$. If the transistor 242 is activated, it will pull the voltage at the output node 238 down until the node voltage is no longer high enough to cause it to conduct. Thus, transistor 242 acts like a clamping diode to ensure that positive overshoots (voltages above VHO) do not occur. VHO and VLO are chosen so that the transistor 242 does not turn on until the voltage at the output node 238 rises above VHO.

Figure 4:
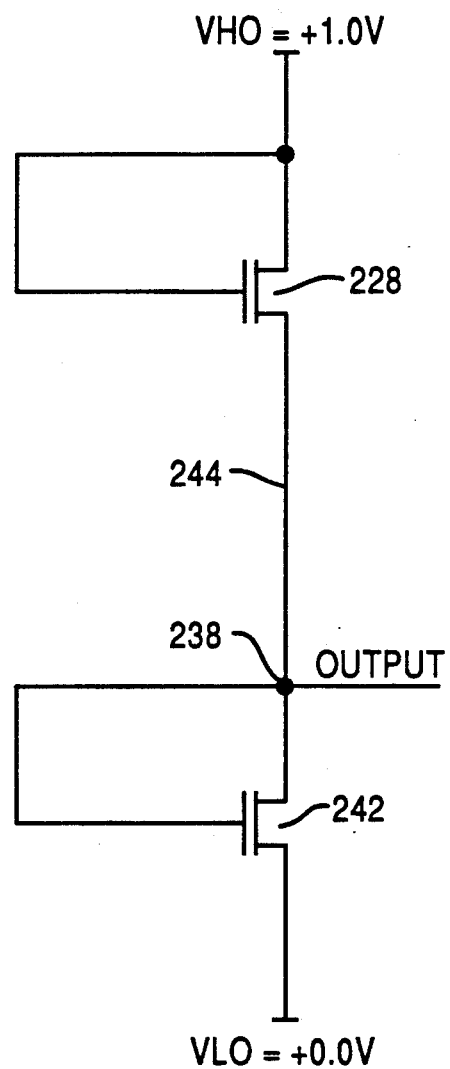
FIG. 4 is an electrical equivalent of the schematic diagram in FIG. 2 when the DISABLE signal is set to 5.0 volts.

The data bus driver 200 is disabled (the tristate mode) by setting the signal DISABLE to 5.0 volts. In this condition, the transistors 218 and 232 are turned off, while the transistors 220 and 236 are turned on. This forces the voltage on line 224 to be equal to VHO, and the voltage on line 234 to be equal to the voltage at the output node 238. In this state, the transistors 210, 212, 216, 218, 220, 226, 230, 232, 236 and 240 do not affect the operation of the bus driver 200. Therefore, a disabled bus driver 200 behaves like the circuit shown in FIG. 4.

The voltages VHO and VLO are chosen so that if the data bus voltage (at node 238) rises above VHO (or VLO-VT$_{242}$, where VT$_{242}$ is the threshold voltage of the transistor 242), the transistor 242 is activated to pull the output node 238 down to VHO. Likewise, if the voltage at the output node 238 falls below VLO (VHO-VT$_{228}$) the transistor 228 is activated to pull the node 238 up to VLO. Thus, whether the data bus driver 200 is enabled or disabled, the transistors 228 and 242 act as clamping diodes to prevent overshoot and undershoot of VHO and VLO, respectively.

An additional benefit of the present invention is the elimination of the prior art problem known by those skilled in the art as the wired-OR glitch.

Variations and modifications to the present invention are possible given the above disclosure. However, such variations and modifications are intended to be within the scope of the invention claimed by this letters patent. Such variations include, inter alia, an inverting data bus driver, circuit variations using P-channel transistors, a different number of clamping transistors, transistor-transistor logic (TTL) compatible drivers, and drivers using gallium arsenide transistors. Also, VLO and VHO may assume values other than those disclosed.

We claim:

1. A high speed digital computer data transfer system for transferring data, said data transfer system having reduced bus state transition time and comprising:
   a driver which receives said data in the form of first and second logic level signals and converts said data to third and fourth logic levels wherein said third and fourth logic levels define a range which is less than a range defined by said first and second logic levels;
   an output node coupled to said driver for transferring said third and fourth logic level signals; and
   a clamping means coupled to said output node for preventing a voltage on said output node from transcending a range defined by said third and fourth logic levels.

2. The data transfer system in claim 1 wherein said clamping means comprises a first clamping diode transistor which activates to pull the voltage on said output node up to said third logic level when said output node falls below said third logic level.

3. The data transfer system in claim 1 wherein said clamping means comprises a clamping diode transistor which activates to pull the voltage on said output node down to said fourth logic level when said output node rises above said fourth logic level.

4. The data transfer system in claim 2 wherein said clamping means comprises a second clamping diode transistor which activates to pull the voltage on said output node down to said fourth logic level when said output node rises above said fourth logic level.

5. The data transfer system in claim 1 wherein said clamping means functions both when said data transfer system is transmitting data and when said data transfer system is not transmitting data.

6. The data transfer system in claim 2 wherein said clamping means functions both when said data transfer system is transmitting data and when said data transfer system is not transmitting data.

7. The data transfer system in claim 3 wherein said clamping means functions both when said data transfer system is transmitting data and when said data transfer system is not transmitting data.

8. The data transfer system in claim 4 wherein said clamping means functions both when said data transfer system is transmitting data and when said data transfer system is not transmitting data.

* * * * *